(12) United States Patent
Chiu et al.

(10) Patent No.: US 9,812,608 B2
(45) Date of Patent: Nov. 7, 2017

(54) DEEP ULTRAVIOLET LIGHT-EMITTING DIODE CHIP AND PACKAGE STRUCTURE CONTAINING THE SAME

(71) Applicants: LITE-ON OPTO TECHNOLOGY (CHANGZHOU) CO., LTD., Jiangsu Province (CN); LITE-ON TECHNOLOGY CORP., Taipei (TW)

(72) Inventors: Kuo-Ming Chiu, Taipei (TW); Meng-Sung Chou, Taipei (TW); Hao-Chung Kuo, Hsinchu County (TW); Che-Yu Liu, Hsinchu County (TW)

(73) Assignees: Lite-On Opto Technology (Changzhou) Co., Ltd., Jiangsu Province (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 15/258,322

(22) Filed: Sep. 7, 2016

(65) Prior Publication Data
US 2017/0271550 A1 Sep. 21, 2017

(30) Foreign Application Priority Data

Mar. 15, 2016 (CN) .......................... 2016 1 0148356

(51) Int. Cl.
*H01L 33/00* (2010.01)
*H01L 33/06* (2010.01)
(Continued)

(52) U.S. Cl.
CPC .............. *H01L 33/06* (2013.01); *H01L 33/12* (2013.01); *H01L 33/32* (2013.01); *H01L 33/483* (2013.01); *H01L 33/60* (2013.01)

(58) Field of Classification Search
CPC ......... H01L 33/06; H01L 33/32; H01L 33/60; H01L 33/483; H01L 33/12
See application file for complete search history.

(56) References Cited

U.S. PATENT DOCUMENTS 5,937,274 A * 8/1999 Kondow ................ B82Y 20/00
257/186
7,483,212 B2 * 1/2009 Cho ........................ G02B 1/113
359/582

(Continued)

OTHER PUBLICATIONS

Neumayer et al., "Materials characterization of ZrO2—SiO2 and HfO2—SiO2 binary oxides deposited by chemical solution deposition", 2001, Journal of Applied Physics, vol. 90, No. 4, pp. 1801-1808 (Aug. 15, 2001).*

*Primary Examiner* — Nikolay Yushin
(74) *Attorney, Agent, or Firm* — Rosenberg, Klein & Lee

(57) ABSTRACT

A deep UV LED chip includes a light-emitting unit, an electrode unit, an electron blocking layer, and an optical layer. The electron blocking layer is disposed between a multiple quantum well layer and a p-type aluminum gallium nitride layer of the light-emitting unit. The optical layer is formed on the light-emitting unit and has a refractive index ranging from 1.0 to 2.3. Another deep UV LED chip further includes a light-transmitting substrate. The optical layer is formed on the light-transmitting substrate and has a refractive index ranging from 1.0 to a refractive index of the light-transmitting substrate. A package structure containing the deep UV LED chip is also disclosed.

18 Claims, 7 Drawing Sheets

(51) Int. Cl.
*H01L 33/32* (2010.01)
*H01L 33/12* (2010.01)
*H01L 33/48* (2010.01)
*H01L 33/60* (2010.01)

(56) References Cited

U.S. PATENT DOCUMENTS

| | | | |
|---|---|---|---|
| 8,637,759 B2* | 1/2014 | Foster | H01L 31/02168 |
| | | | 136/243 |
| 2005/0230672 A1* | 10/2005 | Kurihara | C30B 25/02 |
| | | | 257/11 |
| 2007/0137694 A1* | 6/2007 | Foster | H01L 31/02168 |
| | | | 136/255 |
| 2008/0102259 A1* | 5/2008 | Nikolov | C01G 23/047 |
| | | | 428/213 |
| 2014/0080729 A1* | 3/2014 | Grego | G01N 21/05 |
| | | | 506/9 |
| 2016/0369953 A1* | 12/2016 | Lin | G02B 5/1861 |

* cited by examiner

DEEP ULTRAVIOLET LIGHT-EMITTING DIODE CHIP AND PACKAGE STRUCTURE CONTAINING THE SAME

CROSS-REFERENCE TO RELATED APPLICATION

This application claims priority of Chinese Patent Application No. 201610148356.9, filed on Mar. 15, 2016.

FIELD

The disclosure relates to a light-emitting diode (LED) chip and a package structure containing the same, and more particularly to a deep ultraviolet (UV) LED chip and a package structure containing the same.

BACKGROUND

A UV LED is referred to as an LED having an emission wavelength in a UV range. The emission wavelength of UV LED may be classified into a long wavelength (i.e., UVA) having a wavelength ranging from 315 nm to 400 nm, a medium wavelength (i.e., UVB) having a wavelength ranging from 280 nm to 315 nm, and a short wavelength (i.e., UVC) having a wavelength less than 280 nm.

A short-wavelength UV LED has a wavelength range near to that of X-ray, and thus the short-wavelength UV LED is referred to as a deep UV LED, which in recent years has been primarily made of a light emitting material containing aluminum gallium nitride (AlGaN).

However, the deep UV LED made of the light emitting material containing AlGaN usually has a problem of producing a relatively high voltage due to difficulty in doping with magnesium resulting from an increasing amount of aluminum, and problems of electron leakage and inferior hole-injection efficiency, such that the light-emission performance is affected. Therefore, there is a room for further improvement in light emission efficiency and light extraction efficiency for the deep UV LED die.

In view of the aforesaid, an important research goal of the disclosure is to further develop or design a deep UV LED which effectively enhances light emission efficiency and light extraction efficiency.

SUMMARY

Therefore, an object of the disclosure is to provide a deep UV LED chip.

Another object of the disclosure is to provide a package structure containing the deep UV LED chip.

In the deep UV LED chip of the disclosure, light emission efficiency may be effectively increased and light extraction efficiency may be significantly enhanced by providing an electron blocking layer and an optical layer therein. In addition, in the package structure containing the deep UV LED chip of the disclosure, brightness may be further enhanced by providing a brightness enhancing unit therein.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
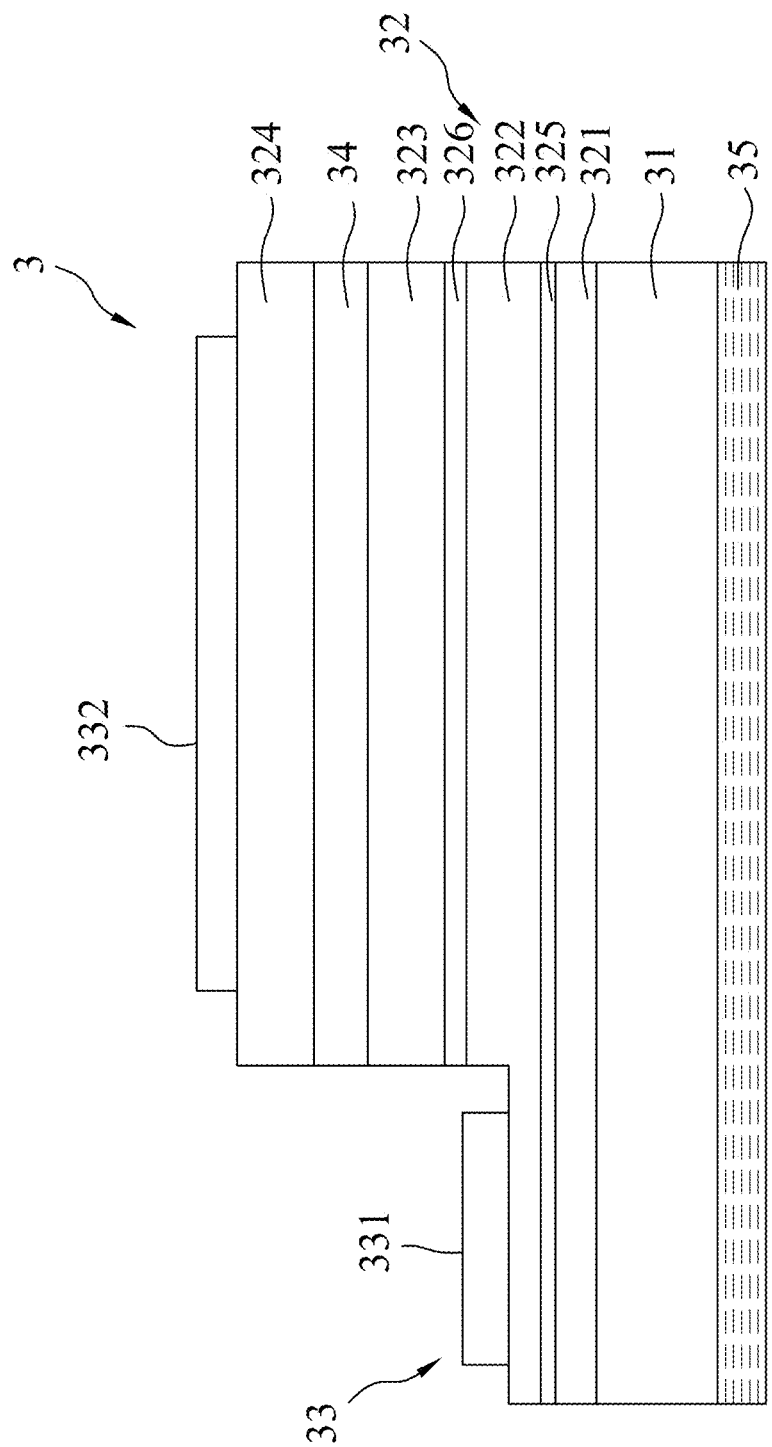
FIG. 1 is a schematic side view illustrating a first embodiment of a deep UV LED chip according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, the first embodiment of a deep UV LED chip according to the disclosure is a deep UV LED chip 3 for flip-chip bonding. The deep UV LED chip includes a light-transmitting substrate 31, a light-emitting unit 32, an electrode unit 33, an electron blocking layer 34, and an optical layer 35.

The light-transmitting substrate 31 may be a sapphire substrate, a silicon carbide (SiC) substrate, or the like. In the embodiment, the light-transmitting substrate 31 is exemplified by the sapphire substrate (i.e., aluminum oxide, $Al_2O_3$) which has a refractive index (n) of 1.77.

The light-emitting unit 32 includes a buffer layer 321, an n-type aluminum gallium nitride (n-AlGaN) layer 322, a multiple quantum well (MQW) layer 323, and a p-type aluminum gallium nitride (p-AlGaN) layer 324 which are sequentially formed on a surface of the light-transmitting substrate 31.

It should be understood that the buffer layer 321 is disposed between the light-transmitting substrate 31 and the n-AlGaN layer 322 so as to alleviate problems such as lattice mismatch, thermal expansion coefficient difference, or the like. The material for the buffer layer 321 may be gallium nitride (GaN), aluminum nitride (AlN), or aluminum gallium nitride (AlGaN). In addition, a photonic crystal structure 325 formed by producing microstructures in neutral AlGaN may be provided between the buffer layer 321 and the n-AlGaN layer 322 so as to enhance an internal quantum efficiency of an LED structure. The material for the photonic crystal structure 325 may be AlGaN, AlN, or a combination thereof.

In addition, it should be understood that an n-type superlattice layer 326 may be provided between the n-AlGaN layer 322 and the multiple quantum well layer 323. The n-type superlattice layer 326 has an effect for alleviating stress imposed on the multiple quantum well layer 323, and may be formed by alternately depositing AlN and AlGaN, or alternately depositing $Al_xGa_{1-x}N$ and $Al_yGa_{1-y}N$, wherein x is not equal to y.

In addition, structural details and suitable materials for the light-emitting unit 32 are well known to those of ordinary skill in the art, and thus are not described in details herein.

The electrode unit 33 is disposed on the light-emitting unit 32 and is used for an external electrical connection. The electrode unit 33 includes a first electrode 331 disposed on the n-AlGaN layer 322, and a second electrode 332 disposed on the p-AlGaN layer 324. Similarly, structural details and suitable materials for the electrode unit 33 are well known to those of ordinary skill in the art, and thus are not described in details herein.

The electron blocking layer 34 is disposed between the multiple quantum well layer 323 and the p-AlGaN layer 324, and is primarily used for improving a hole transmission effect and enhancing an electron blocking capability so as to increase the probability of the recombination of electrons and holes, increase an internal quantum efficiency, and to increase a light emission efficiency.

In a certain embodiment, the electron blocking layer 34 is made of a material of $Al_{(x)}Ga_{(1-x)}N$ having a gradually varying amount of aluminum wherein x ranges from 0.05 to 0.8. Specifically, the x value for the amount of aluminum is gradually decreased from a first value to a second value, and is then gradually increased from the second value to a third value in a direction away from the p-AlGaN layer 324. The third value is smaller than the first value. The first value ranges from 0.35 to 0.8, the second value ranges from 0.05 to 0.35, and the third value ranges from 0.2 to 0.6. In a certain embodiment, the first value, the second value, and the third value are 0.65, 0.15, and 0.2, respectively.

It should be understood herein that a film structure having a first thickness is formed in an interval between the first value and the second value and another film structure having a second thickness is formed in an interval between the second value and the third value. The electron blocking layer 34 is composed of the film structure having the first thickness and the another film structure having the second thickness. The first thickness is larger than the second thickness. An overall thickness of the electron blocking layer 34 (i.e., a sum of the first thickness and the second thickness) ranges from 5 nm to 100 nm.

In addition, it should be understood that the purpose of using the electron blocking layer 34 having a gradually varying amount of aluminum is to increase an energy barrier of a conduction band (i.e., to maintain an electron blocking effect) and to increase hole transmission in the interval between the first value and the second value, and to prevent the deep UV LED chip from producing a current leakage phenomenon at high current density in the interval between the second value and the third value. Generally speaking, the electron blocking layer 34 having a gradually varying amount of aluminum is provided for increasing a height of the energy barrier so as to decrease electron leakage and for significantly improving a hole transmission effect and enhancing an electron blocking capability so as to increase the probability of the recombination of electrons and holes and to increase a light emission efficiency.

The optical layer 35 is formed on the light-transmitting substrate 31 and opposite to the light-emitting unit 32, and has a refractive index ranging from 1.0 to the refractive index of the light-transmitting substrate 31. Since the light-transmitting substrate 31 used in the embodiment is a sapphire substrate having a refractive index of 1.77, the optical layer 35 has a refractive index ranging from 1.0 to 1.77. The optical layer 35 is a graded refractive index layer having a multi-layer structure. Each layer in the multi-layer structure has a composition of $(HfO_2)_y(SiO_2)_{100\%-y}$, wherein y ranges from 0% to 50%. A refractive index distribution of the multi-layer structure gradually decreases in a direction away from the light-transmitting substrate 31. The refractive index of silicon dioxide ($SiO_2$) is 1.45. The refractive index of hafnium dioxide ($HfO_2$) is 2.1. In a certain embodiment, the optical layer 35 has a thickness ranging from 71 nm to 99 nm.

Specifically, a difference between the refractive index of the light-transmitting substrate 31 (a refractive index: 1.77) and that of ambient air (a refractive index: 1) is liable to lead to total reflection of the light intended to be transmitted to the ambient air through the light-transmitting substrate 31 such that a light extraction efficiency is reduced. The optical layer 35 is provided for decreasing the difference between the refractive index of the light-transmitting substrate 31 and that of the ambient air so as to increase a critical angle causing the total reflection of the light intended to be transmitted to the ambient air through the light-transmitting substrate 31 and to increase a light-emitting angle of the light. The probability of the total reflection of the light caused at an interface between the ambient air and the light-transmitting substrate 31 is reduced such that the light extraction efficiency may be effectively enhanced.

Figure 2:
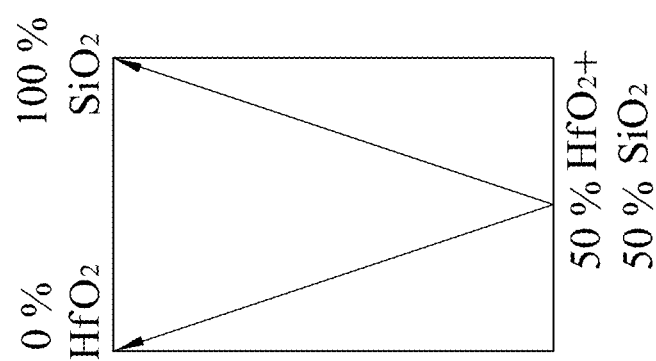
FIG. 2 is a schematic view illustrating composition ratios of materials for forming an optical layer in the first embodiment of the disclosure.

Referring to FIG. 2, variation of the refractive indices of the optical layer 35 may be controlled by varying composition ratio of materials for forming the optical layer 35. Specifically, the optical layer 35 is a graded refractive index layer having a composition of $(HfO_2)_y(SiO_2)_{100\%-y}$, wherein y is within a range from 0% to 100% and is gradually decreased in a direction away from the light-transmitting substrate 31. As described above, the optical layer 35 in the embodiment has varying refractive indices that range from 1.0 to 1.77. Since silicon dioxide has a refractive index of 1.45 and hafnium dioxide has a refractive index of 2.1, the mole fractional value (i.e., y) of $HfO_2$ and the mole fractional value (i.e., 100%−y) of $SiO_2$ should be controlled in a range from 0% to 50% and in a range from 50% to 100%, respectively. In other words, the optical layer 35 in the embodiment is a graded refractive index layer having a composition of $(HfO_2)_y(SiO_2)_{100\%-y}$, wherein y is 50% at a level proximate to the light-transmitting substrate 31 and is gradually decreased to 0% in a direction away from the light-transmitting substrate 31 (i.e., y is 0% at a level distal from the light-transmitting substrate 31). The optical layer 35 having varying refractive indices ranging from 1.45 to 1.77 is obtained thereby.

Figure 3:
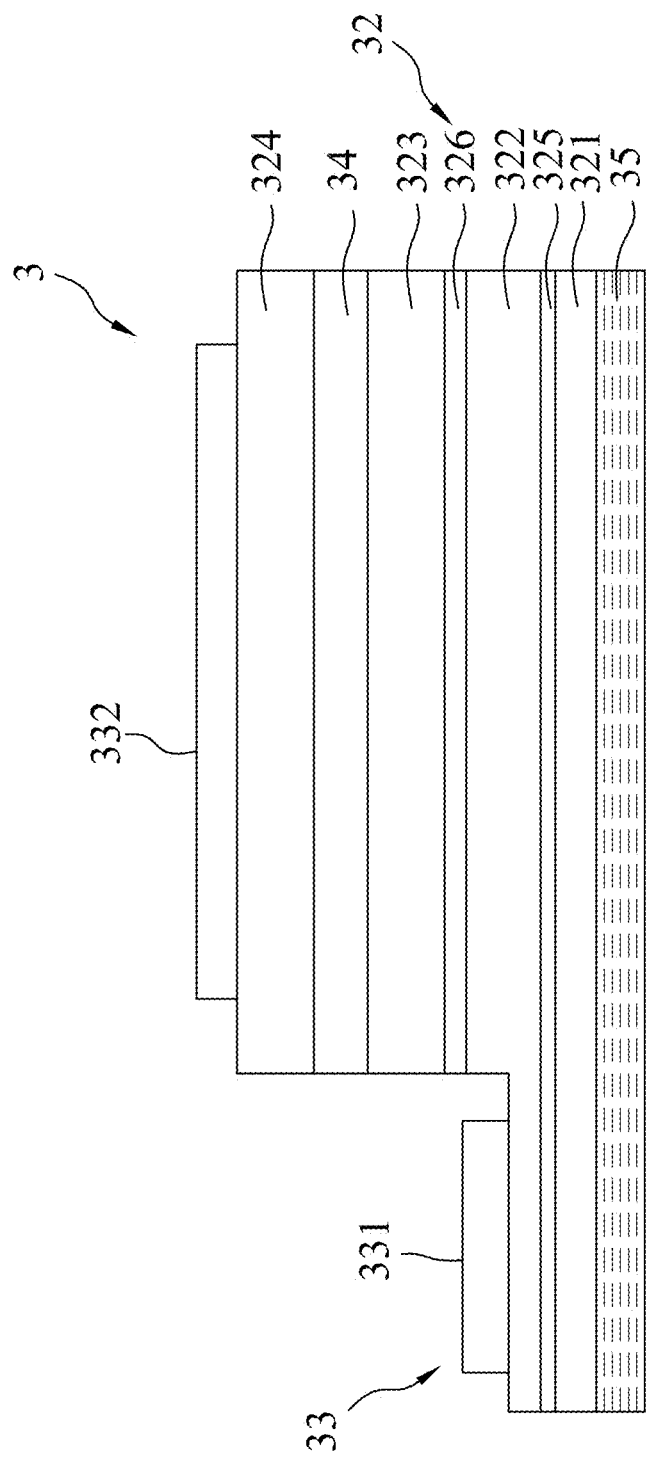
FIG. 3 is a schematic side view illustrating a second embodiment of a deep UV LED chip according to the disclosure.

Referring to FIG. 3, the second embodiment of the deep UV LED chip 3 of the disclosure is substantially the same as the first embodiment except that in the second embodiment, the light-transmitting substrate 31 is removed after the light-emitting unit 32 is formed thereon, and the optical layer 35 is then formed on the light-emitting unit 32 and opposite to the electrode unit 33. That is, the optical layer 35 is formed directly on the buffer layer 321.

It should be understood herein that in the second embodiment, since the optical layer 35 is formed directly on the buffer layer 321 made of AlGaN and a refractive index of AlGaN is 2.3, a refractive index of the optical layer 35 in the second embodiment should be in a range from 1.0 to 2.3. Therefore, the optical layer 35 in the second embodiment is a graded refractive index layer having a composition of $(HfO_2)_y(SiO_2)_{100\%-y}$, wherein y ranges from 0% to 100% and is gradually decreased in a direction away from the buffer layer 321. In addition, the optical layer 35 in the second embodiment has a thickness ranging from 78 nm to 109 nm.

Figure 4:
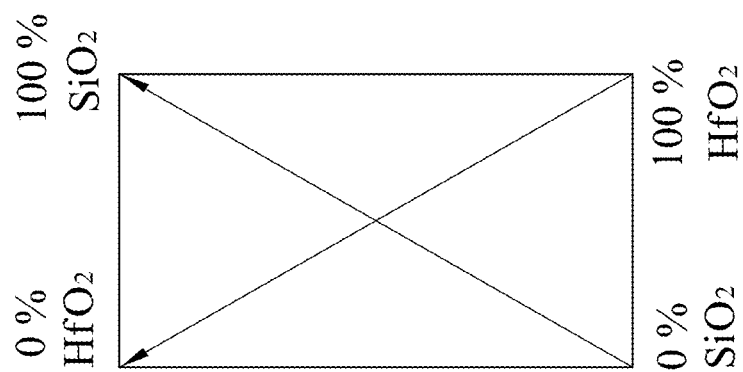
FIG. 4 is a schematic view illustrating composition ratios of materials for forming an optical layer in the second embodiment of the disclosure.

Referring to FIG. 4, the refractive indices of the optical layer 35 in the second embodiment are controlled in a manner similar to those for the optical layer 35 in the first embodiment except that since the refractive indices of $SiO_2$ and $HfO_2$ are 1.45 and 2.1, respectively, which are both in a range from 1.0 to 2.3, the optical layer 35 in the second embodiment may be a graded refractive index layer having a composition of $(HfO_2)_y (SiO_2)_{100\%-y}$, wherein y ranges from 0% to 100% and is gradually decreased in a direction away from the buffer layer 321. In other words, the optical layer 35 in the second embodiment is a graded refractive index layer having a composition of $(HfO_2)_y (SiO_2)_{100\%-y}$, wherein y is 100% at a level proximate to the buffer layer 321 and is gradually decreased to 0% in a direction away from the buffer layer 321 (i.e., y is 0% at a level distal from the buffer layer 321). The optical layer 35 having varying refractive indices ranging from 1.45 to 2.1 is obtained thereby.

In the first and second embodiments, the optical layer 35 is provided for reducing the difference between the refractive index of the light-transmitting substrate 31 or the light-emitting unit 32 and that of the ambient air so as to enhance the light extraction efficiency of the deep UV LED chip. In addition, the electron blocking layer 34 is provided for further enhancing the light emission efficiency.

Each of the deep UV LED chips 3 of the first and second embodiments may be bonded using a flip chip technique to obtain a package structure containing the deep UV LED chip 3. The deep UV LED chip 3 of the first embodiment is used for the following description.

Figure 5:
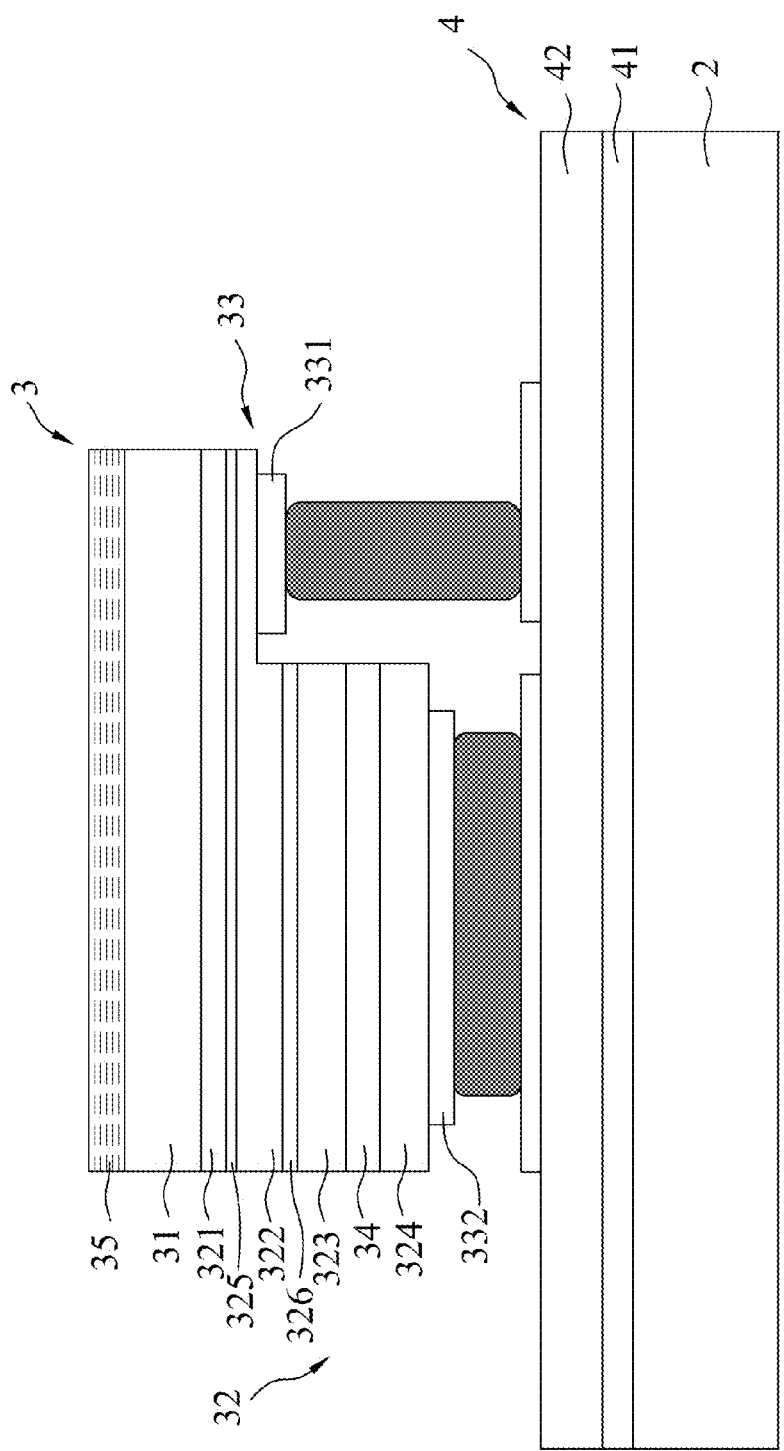
FIG. 5 is a schematic side view illustrating an embodiment of a package structure according to the disclosure which contains the first embodiment of the deep UV LED chip.

FIG. 5 illustrates a package structure obtained by bonding the deep UV LED chip 3 of the first embodiment using a flip chip bonding technology. An embodiment of the package structure of the disclosure includes a carrier 2 and the deep UV LED chip 3 mentioned above. The details for the flip chip bonding technique are well known to those of ordinary skill in the art, and thus are not described herein.

Specifically, the carrier 2 is provided with a brightness enhancing unit 4 prior to bonding with the deep UV LED chip 3. Therefore, the brightness enhancing unit 4 is provided between the deep UV LED chip 3 and the carrier 2 in the package structure thus obtained.

The brightness enhancing unit 4 includes an aluminum layer 41 formed on the carrier 2 and a reflection layer 42 formed on the aluminum layer 41. The reflection layer 42 includes at least ten pairs of reflection films, each pair of the reflection films including a first reflection film and a second reflection film. The reflection layer 42 is formed by alternately depositing the first and second reflection films on the aluminum layer 41. The first reflection film is made of $SiO_2$, and the second reflection film is made of $HfO_2$.

The brightness enhancing unit 4 is used for enhancing brightness of the deep UV LED chip 3. Although the aluminum layer 41 has high reflection, it is liable to oxidize. Therefore, the reflection layer 42 is provided for enhancing light reflection and for protecting the aluminum layer 41 from oxidation such that light emitted from the deep UV LED chip 3 may be reflected by the brightness enhancing unit 4 so as to increase the light extraction efficiency.

Figure 6:
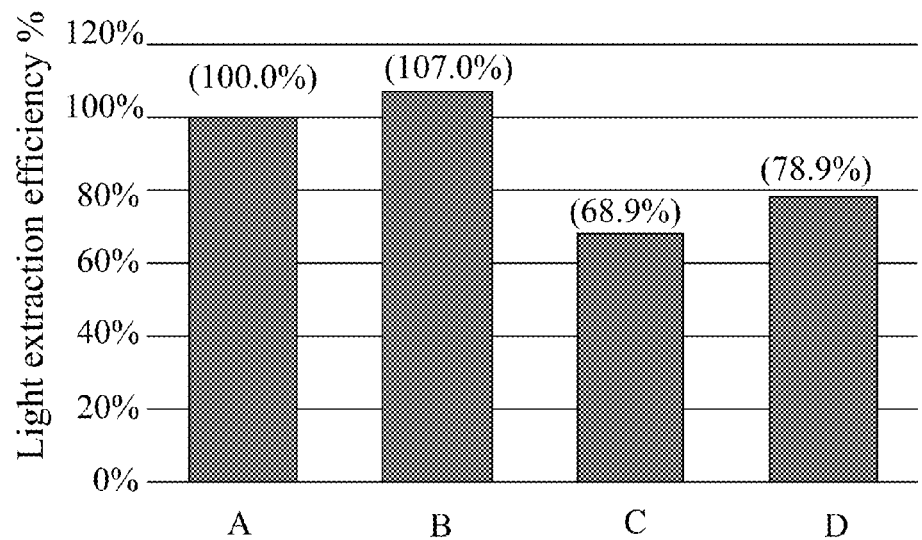
FIG. 6 is a graph showing light extraction efficiencies of deep UV LED chips measured after flip chip bonding.

FIG. 6 illustrates the light extraction efficiencies of the deep UV LED chips measured after flip chip bonding. Structure B in FIG. 6 is the deep UV LED chip 3 of the first embodiment shown in FIG. 1, which includes the optical layer 35, the light-transmitting substrate 31, the buffer layer 321, the photonic crystal structure 325, the n-AlGaN layer 322, the n-type superlattice layer 326, the multiple quantum well layer 323, the electron blocking layer 34, the p-AlGaN layer 324, and the second electrode 332 in sequence. Structure A is similar to structure B except that structure A does not include the optical layer 35. As shown in FIG. 6, compared to the light extraction efficiency of structure A, the light extraction efficiency of structure B is increased by 7% mW via provision of the optical layer 35 therein. In addition, Structure D in FIG. 6 is the deep UV LED chip 3 of the second embodiment shown in FIG. 3, which includes the optical layer 35, the buffer layer 321, the photonic crystal structure 325, the n-AlGaN layer 322, then-type superlattice layer 326, the multiple quantum well layer 323, the electron blocking layer 34, the p-AlGaN layer 324, and the second electrode 332 in sequence. Structure C is similar to structure D except that structure C does not include the optical layer 35. As shown in FIG. 6, compared to the light extraction efficiency of structure C, the light extraction efficiency of structure D is increased by 10% mW via provision of the optical layer 35 therein.

Figure 7:
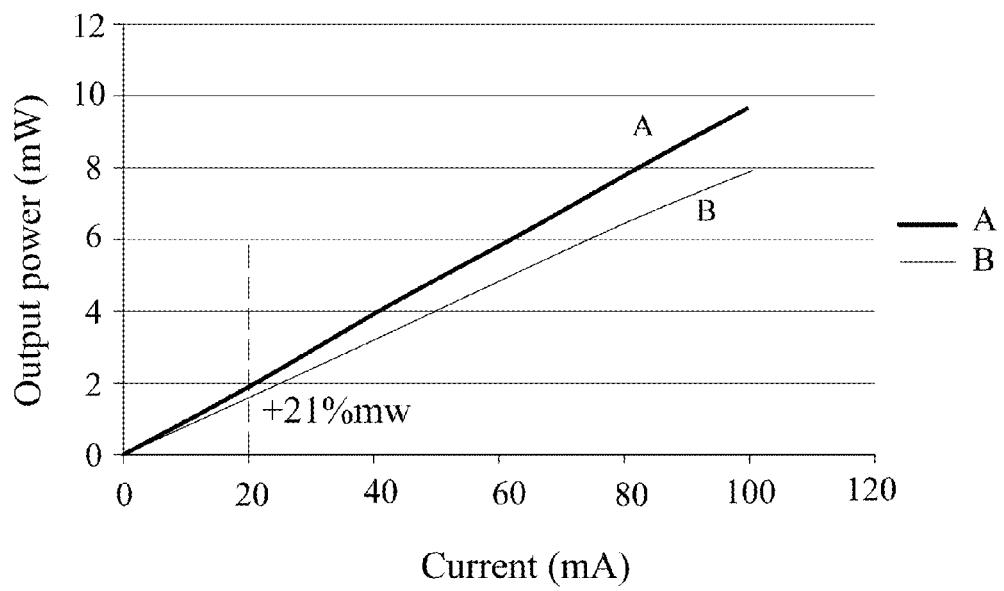
FIG. 7 is a graph showing output powers of deep UV LED chips measured after flip chip bonding.

FIG. 7 also illustrates the output power of the deep UV LED chips measured after flip chip bonding. Structure A is a deep UV LED chip having a structure similar to that of the deep UV LED chip 3 of the first embodiment except that structure A does not include the optical layer 35. In addition, the electron blocking layer 34 in structure A is made of a material of $Al_{(x)}Ga_{(1-x)}N$ having a gradually varying amount of aluminum wherein the x value for the amount of aluminum is gradually decreased from a first value of 0.65 to a second value of 0.15, and is then gradually increased from the second value of 0.15 to a third value of 0.2 in a direction away from the p-AlGaN layer 324. Structure B is similar to structure A except that the electron blocking layer 34 in structure B is made of a material of $Al_{(x)}Ga_{(1-x)}N$ having a gradually varying amount of aluminum wherein the x value for the amount of aluminum is gradually decreased from a first value of 0.65 to a second value of 0.55, and is then gradually decreased from the second value of 0.55 to a third value of 0 in a direction away from the p-AlGaN layer 324. As shown in FIG. 7, the output power of the deep UV LED chip is increased by 21% mW (from 1.62 mW to 1.96 mW in FIG. 7) by using the electron blocking layer 34 which is made of the material of $Al_{(x)}Ga_{(1-x)}N$ having a gradually varying amount of aluminum controlled by the manner of the disclosure.

Figure 8:
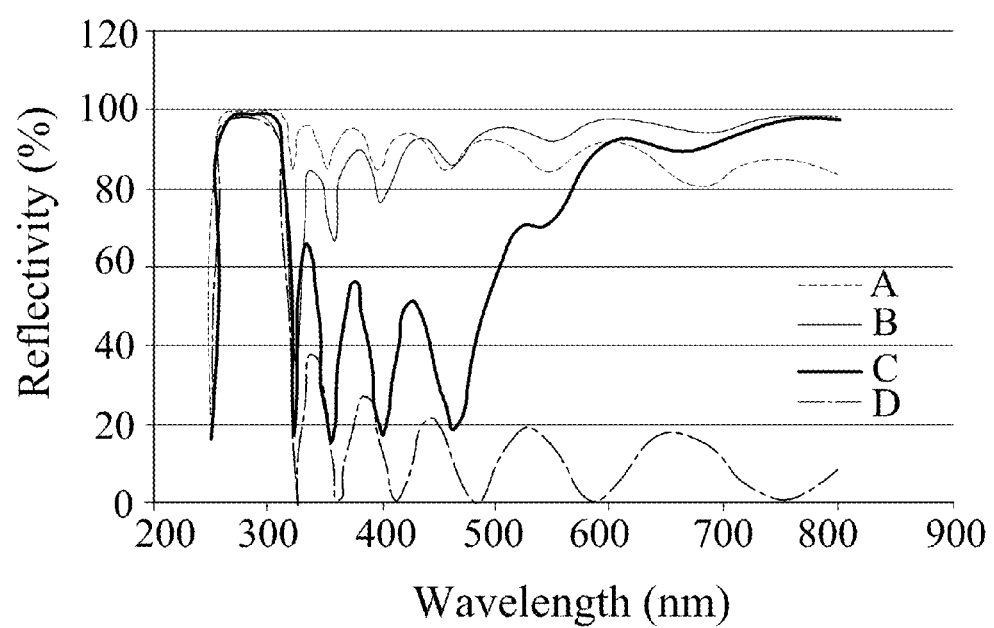
FIG. 8 is a graph showing light reflectivities of deep UV LED chips measured after flip chip bonding.

FIG. 8 illustrates light reflectivities of the package structures shown in FIG. 5. Structure A is a package structure in which the deep UV LED chip of the first embodiment including the optical layer 35, the light-transmitting substrate 31, the buffer layer 321, the photonic crystal structure 325, the n-AlGaN layer 322, n-type superlattice layer 326, the multiple quantum well layer 323, the electron blocking layer 34, the p-AlGaN layer 324, and the second electrode 332 is included. The refractive index of the optical layer 35 is controlled to be 1.77. The brightness enhancing unit 4 includes the aluminum layer 41 and the reflective layer 42 including at least ten pairs of reflection films, each pair of the reflection films including an $SiO_2$ film (47 nm) and an $HfO_2$ film (34 nm). Structures B, C, and D are similar to structure A except that a silver layer is used for replacing the aluminum layer 41 in structure B, a gold layer is used for replacing the aluminum layer 41 in structure C, and the aluminum layer 41 is not included in structure D. As shown in FIG. 8, the brightness enhancing unit 4 including the aluminum layer 41 and the reflective layer 42 may be used for enhancing a reflective effect.

In view of the aforesaid, in the deep UV LED chip 3 of the disclosure, the optical layer 35 is provided for alleviating the problem resulting from the difference between the refractive index of the light-transmitting substrate 31 and that of the ambient air so as to enhance the light extraction efficiency of the deep UV LED chip 3. In addition, the electron blocking layer 34 is provided for increasing the probability of the recombination of electrons and holes so as to enhance the internal quantum efficiency and the light emission efficiency. In the package structure including the deep UV LED chip of the disclosure, the brightness enhancing unit 4 is provided for enhancing the brightness.

In the description above, for the purposes of explanation, numerous specific details have been set forth in order to provide a thorough understanding of the embodiment(s). It will be apparent, however, to one skilled in the art, that one or more other embodiments may practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connect ion with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A deep ultraviolet light-emitting diode chip comprising:
a light-transmitting substrate;
a light-emitting unit including a buffer layer, an n-type aluminum gallium nitride layer, a multiple quantum well layer, and a p-type aluminum gallium nitride layer which are formed in sequence on said light-transmitting substrate;
an electrode unit including a first electrode disposed on said n-type aluminum gallium nitride layer, and a second electrode disposed on said p-type aluminum gallium nitride layer;
an electron blocking layer disposed between said multiple quantum well layer and said p-type aluminum gallium nitride layer; and
an optical layer formed on said light-transmitting substrate and opposite to said light-emitting unit,
wherein said optical layer is a graded refractive index layer having a refractive index ranging from 1.0 to a refractive index of said light-transmitting substrate, said graded refractive index layer including a multi-layer structure, each layer in said multi-layer structure having a composition of $(HfO_2)_y(SiO_2)_{100\%-y}$, wherein y ranges from 0% to 50%, and a refractive index distribution of said multi-layer structure gradually decreases in a direction away from said light-transmitting substrate.

2. The deep ultraviolet light-emitting diode chip according to claim 1, wherein said optical layer has a thickness ranging from 71 nm to 99 nm.

3. The deep ultraviolet light-emitting diode chip according to claim 1, wherein the electron blocking layer is made of a material of $Al_{(x)}Ga_{(1-x)}N$ having a gradually varying amount of aluminum,
wherein x ranges from 0.05 to 0.8, and is gradually decreased from a first value to a second value and is then gradually increased from the second value to a third value in a direction away from said p-type aluminum gallium nitride layer, the third value being smaller than the first value.

4. The deep ultraviolet light-emitting diode chip according to claim 3, wherein the first value ranges from 0.35 to 0.8, the second value ranges from 0.05 to 0.35, and the third value ranges from 0.2 to 0.6.

5. The deep ultraviolet light-emitting diode chip according to claim 4, wherein the first value, the second value, and the third value are 0.65, 0.15, and 0.2, respectively.

6. A package structure comprising:
a carrier; and
the deep ultraviolet light-emitting diode chip according to claim 1 disposed on said carrier by flip-chip bonding.

7. The package structure according to claim 6, further comprising a brightness enhancing unit which is formed on said carrier and which is disposed between said deep ultraviolet light-emitting diode chip and said carrier.

8. The package structure according to claim 7, wherein said brightness enhancing unit includes an aluminum layer formed on said carrier and a reflection layer formed on said aluminum layer, said reflection layer including at least ten pairs of reflection films, each pair of said reflection films including a first reflection film and a second reflection film, said reflection layer being formed by alternately depositing said first and second reflection films on said aluminum layer.

9. The package structure according to claim 8, wherein said first reflection film is made of silicon dioxide, and said second reflection film is made of hafnium dioxide.

10. A deep ultraviolet light-emitting diode chip comprising:
a light-emitting unit including a buffer layer, an n-type aluminum gallium nitride layer, a multiple quantum well layer, and a p-type aluminum gallium nitride layer which are formed in sequence;
an electrode unit including a first electrode disposed on said n-type aluminum gallium nitride layer, and a second electrode disposed on said p-type aluminum gallium nitride layer;
an electron blocking layer disposed between said multiple quantum well layer and said p-type aluminum gallium nitride layer; and
an optical layer formed on said light-emitting unit and opposite to said electrode unit,
wherein said optical layer is a graded refractive index layer having a refractive index ranging from 1.0 to 2.3, said graded refractive index layer including a multi-layer structure, each layer in said multi-layer structure having a composition of $(HfO_2)_y(SiO_2)_{100\%-y}$, wherein y ranges from 0% to 100%, a refractive index distribution of said multi-layer structure gradually decreasing in a direction away from said buffer layer.

11. The deep ultraviolet light-emitting diode chip according to claim 10, wherein said optical layer has a thickness ranging from 78 nm to 109 nm.

12. The deep ultraviolet light-emitting diode chip according to claim 10, wherein the electron blocking layer is made of a material of $Al_{(x)}Ga_{(1-x)}N$ having a gradually varying amount of aluminum,
wherein x ranges from 0.05 to 0.8, and is gradually decreased from a first value to a second value and is then gradually increased from the second value to a third value in a direction away from said p-type aluminum gallium nitride layer, the third value being smaller than the first value.

13. The deep ultraviolet light-emitting diode chip according to claim 12, wherein the first value ranges from 0.35 to 0.8, the second value ranges from 0.05 to 0.35, and the third value ranges from 0.2 to 0.6.

14. The deep ultraviolet light-emitting diode chip according to claim 13, wherein the first value, the second value, and the third value are 0.65, 0.15, and 0.2, respectively.

15. A package structure comprising:
 a carrier; and
 the deep ultraviolet light-emitting diode chip according to claim 10 disposed on said carrier by flip-chip bonding.

16. The package structure according to claim 15, further comprising a brightness enhancing unit which is formed on said carrier and which is disposed between said deep ultraviolet light-emitting diode chip and said carrier.

17. The package structure according to claim 16, wherein said brightness enhancing unit includes an aluminum layer formed on said carrier and a reflection layer formed on said aluminum layer, said reflection layer including at least ten pairs of reflection films, each pair of said reflection films including a first reflection film and a second reflection film, said reflection layer being formed by alternately depositing said first and second reflection films on said aluminum layer.

18. The package structure according to claim 17, wherein said first reflection film is made of silicon dioxide, and said second reflection film is made of hafnium dioxide.

* * * * *